(12) United States Patent
Yang et al.

(10) Patent No.: US 10,804,330 B2
(45) Date of Patent: Oct. 13, 2020

(54) MULTI-VIEW DISPLAY DEVICE

(71) Applicant: LG Display Co., Ltd., Seoul (KR)

(72) Inventors: Yu-Cheol Yang, Paju-si (KR); Ji-ho Ryu, Paju-si (KR); Yong-Baek Lee, Paju-si (KR); Dong-Young Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/211,085

(22) Filed: Dec. 5, 2018

(65) Prior Publication Data

US 2019/0189704 A1 Jun. 20, 2019

(30) Foreign Application Priority Data

Dec. 18, 2017 (KR) ........................ 10-2017-0173898

(51) Int. Cl.
*H01L 27/32* (2006.01)
*H04N 13/31* (2018.01)
*G09G 3/00* (2006.01)
*G09G 3/3225* (2016.01)
*H01L 51/52* (2006.01)
(Continued)

(52) U.S. Cl.
CPC ......... *H01L 27/3218* (2013.01); *G09G 3/003* (2013.01); *G09G 3/3225* (2013.01); *H01L 27/322* (2013.01); *H01L 27/326* (2013.01); *H01L 27/3246* (2013.01); *H01L 27/3283* (2013.01); *H01L 51/5218* (2013.01); *H01L 51/5221* (2013.01); *H01L 51/5256* (2013.01); *H04N 13/31* (2018.05); *G09G 3/3208* (2013.01); *G09G 2300/0452* (2013.01);
(Continued)

(58) Field of Classification Search
None
See application file for complete search history.

(56) References Cited

U.S. PATENT DOCUMENTS 8,253,781 B2 8/2012 Louwsma et al.
8,976,235 B2 3/2015 Yun et al.
(Continued)

FOREIGN PATENT DOCUMENTS

CN 102621735 A 8/2012
CN 104282721 A 1/2015
(Continued)

OTHER PUBLICATIONS

Taiwan Intellectual Property Office, First Office Action, TW Patent Application No. 107142775, dated Aug. 13, 2019, six pages.
(Continued)

*Primary Examiner* — Steven B Gauthier
(74) *Attorney, Agent, or Firm* — Fenwick & West LLP

(57) ABSTRACT

A multi-view display device displays a first image, a second image, and a third image generated using the arrangement structure of subpixels and color filters, the gaps between the subpixels, and the arrangement structure of black matrices. The first to third red subpixels of the first to third subpixel groups display a red portion of the first to third images, the first to third green subpixels of the first to third subpixel groups display a green portion of the first to third images, and the first to third blue subpixels of the first to third subpixel groups display a blue portion of the first to third images.

19 Claims, 7 Drawing Sheets

(51) Int. Cl.
    *G09G 3/3208* (2016.01)
    *H01L 51/56* (2006.01)
(52) U.S. Cl.
    CPC ........ *G09G 2320/028* (2013.01); *H01L 51/56* (2013.01); *H04N 2213/001* (2013.01)

(56) References Cited

U.S. PATENT DOCUMENTS

| | | | |
|---|---|---|---|
| 9,570,527 | B2 | 2/2017 | Namkung |
| 2007/0008456 | A1 | 1/2007 | Lesage et al. |
| 2009/0091613 | A1 | 4/2009 | Louwsma et al. |
| 2010/0109511 | A1* | 5/2010 | Kim et al. .......... H01L 27/3258 313/504 |
| 2011/0121719 | A1* | 5/2011 | Yokoyama .......... H01L 27/3248 313/504 |
| 2012/0194510 | A1 | 8/2012 | Yun et al. |
| 2015/0001477 | A1 | 1/2015 | Namkung |
| 2015/0022721 | A1 | 1/2015 | Agarwal |
| 2015/0193965 | A1 | 7/2015 | Chen et al. |
| 2015/0236076 | A1 | 8/2015 | Sim et al. |
| 2019/0189705 | A1* | 6/2019 | Yang .................. H01L 51/5221 |

FOREIGN PATENT DOCUMENTS

| | | |
|---|---|---|
| CN | 105409214 A | 3/2016 |
| JP | 2009-186876 A | 8/2009 |
| KR | 10-2010-0043943 A | 4/2010 |
| KR | 10-2017-0019511 A | 2/2017 |
| TW | 200919018 A | 5/2009 |

OTHER PUBLICATIONS

European Patent Office, Extended European Search Report, EP Patent Application No. 18211357.1, dated May 22, 2019, five pages.
China National Intellectual Property Administration, Office Action, CN Patent Application No. 201811540039.7, dated Jun. 22, 2020, 11 pages.

* cited by examiner

MULTI-VIEW DISPLAY DEVICE

CROSS-REFERENCE TO RELATED APPLICATIONS

The present application claims the priority from and the benefit of Korean Patent Application No. 10-2017-0173898 filed in Republic of Korea on Dec. 18, 2017, which is hereby incorporated by reference in its entirety.

BACKGROUND

Field of the Disclosure

The present disclosure relates to a multi-view display device, and more particularly, to a multi-view display device having a uniform high luminance.

Discussion of the Related Art

Recently, with the advent of an information-oriented society, as interest in information displays for processing and displaying a massive amount of information and demand for portable information media have increased, a display field has rapidly advanced. Thus, various lightweight and thin flat panel display devices have been developed and highlighted.

As examples of the flat display devices, there are a liquid crystal display (LCD) device, a plasma display panel (PDP) device, a field emission display (FED) device, an electroluminescence display (ELD) device, an organic light emitting diode display (OLED) device, and the like. The flat display devices exhibit excellent characteristics in terms of thinning, lightening, and reductions in the power consumption thereof and thus have rapidly replaced the conventional cathode ray tube (CRT) displays.

Among the flat panel display devices, the OLED device is a self-luminescent type device and does not require a backlight unit used in the LCD device as a non-self luminescent type device. As a result, the OLED device can be lightweight and thin.

In addition, the OLED device has advantages of a viewing angle, a contrast ratio, and power consumption as compared with the LCD device. Furthermore, the OLED device may be driven with a low direct current (DC) voltage and has a rapid response speed. Moreover, since inner elements of the OLED device are in a solid state, the OLED device has high durability against an external impact and has a wide available temperature range.

Particularly, since a manufacturing process of the OLED device is simple, the OLED device has an advantage in that a production cost can be saved more than the conventional LCD.

The OLED device is a self-luminescent element that emits light through an LED, and the LED emits light through an organic electroluminescence phenomenon.

FIG. 1 is a band diagram of an LED having an emission principle based on a general organic electroluminescence phenomenon.

As illustrated in FIG. 1, an LED 10 is formed of an anode 21, a cathode 25, and an organic light emitting layer disposed therebetween. The organic light emitting layer is formed of a hole transport layer (HTL) 33, an electron transport layer (ETL) 35, and an emitting material layer (EML) 40 interposed between the HTL 33 and the ETL 35.

To improve luminous efficiency, a hole injection layer (HIL) 37 is interposed between the anode electrode 21 and the HTL 33, and an electron injection layer (EIL) 39 is interposed between the cathode electrode 25 and the ETL 35.

In the LED 10, when a positive voltage and a negative voltage are applied to the anode 21 and the cathode 25, respectively, the holes of the anode electrode 21 and the electrons of the cathode electrode 25 are transported to the EML 40 and form excitons, and when such excitons are transitioned from an excited state to a ground state, light is generated and emitted in the form of visible light by the EML 40.

The OLED device including the LED 10 is designed as a two-dimensional display that can be simultaneously viewed by multiple users.

Such the display characteristic of the display allows a viewer to view the same high-quality image from different angles.

However, recently, it is required that each user can view different information from the same display. For example, a driver in a vehicle may want to view navigation data while a passenger may want to watch a movie. In another example, each player in a computer game for two or more players may want to watch the game in his or her own view.

These conflicting requirements can be met by providing two separate displays, but this will require excessive space and increase the cost.

SUMMARY

Accordingly, the present disclosure is directed to a multi-view display device that substantially obviates one or more of the problems due to limitations and disadvantages of the related art.

An object of the present disclosure is to provide a multi-view display device that can display two or more images such that the images are visible in different directions.

Another object of the present disclosure is to provide a multi-view display device that can improve luminance of the multiple views.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a multi-view display device includes a unit pixel comprising a first, a second, and a third subpixel group on an array substrate. In the unit pixel, a first, a second, and a third bank pattern correspond to the first, the second, and the third subpixel group, respectively, each bank pattern including a first inclined surface, a second inclined surface, and a flat surface connecting the first inclined surface and the second inclined surface. A red color filter corresponds to the first subpixel group, a green color filter corresponds to the second subpixel group, and the blue color filter corresponds to the third subpixel group, the red color filter, the green color filter, and the blue color filter on a color filter encapsulation substrate above the array substrate. A first red, a first green, and a first blue subpixel of the first subpixel group are each on a different surface of the first inclined surface, the second inclined surface, and the flat surface of the first bank pattern. A second red, a second green, and a second blue subpixels of the second subpixel group are each on a different surface of the first inclined surface, the second inclined surface, and the flat surface of the second bank pattern. A third red, a third green, and a third blue subpixels of the third subpixel group are each on a different surface of the first inclined surface, the second inclined surface, and the flat surface of the third bank pattern. The first subpixel group displays a first image, the second subpixel group displays a second image, and the third subpixel group displays a third image.

To achieve these and other advantages and in accordance with the purpose of the present disclosure, as embodied and broadly described herein, a multi-view display device includes pixels on an array substrate, each pixel including subpixel groups of adjacent subpixels emitting different colors, subpixels in each subpixel group configured to emit colored light in different directions by having emitting layers oriented in different directions at least two of which are slanted with respect to a top surface of the array substrate. Each pixel also includes a black matrix configured to pass portions of the emitted colored light from the subpixels and block other portions of the emitted colored light from the subpixels to form multiple images at different viewing angles relative to the multi-view display panel.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

Hereinafter, exemplary embodiments according to the present disclosure will be described in detail with reference to the accompanying drawings.

Figure 1:
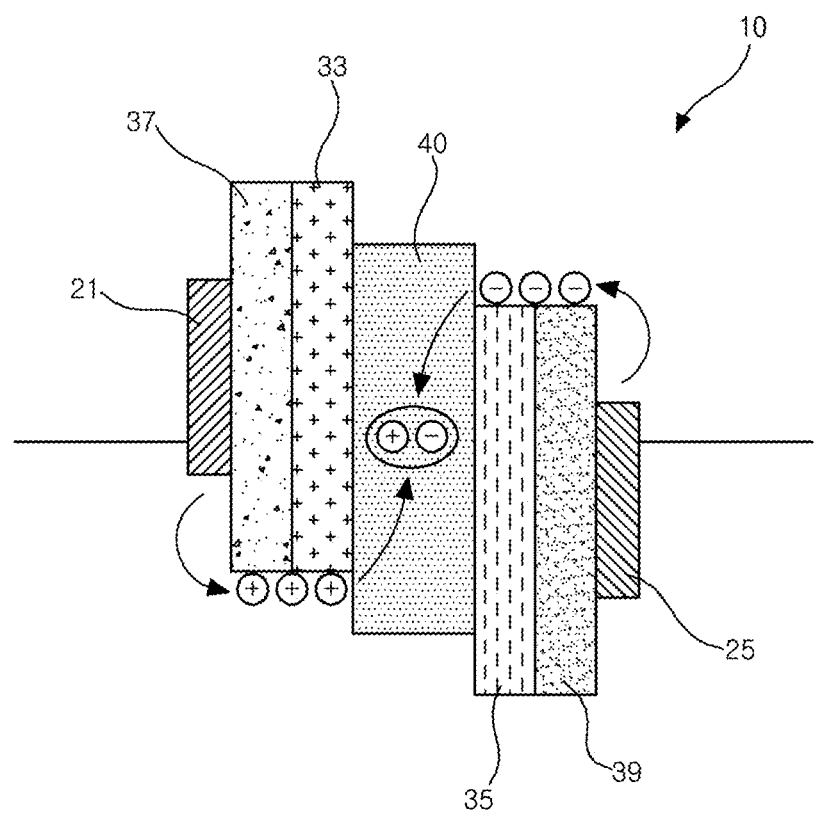
FIG. 1 is a band diagram of a light emitting diode (LED) having an emission principle based on a general organic electroluminescence phenomenon.
Figure 2A:
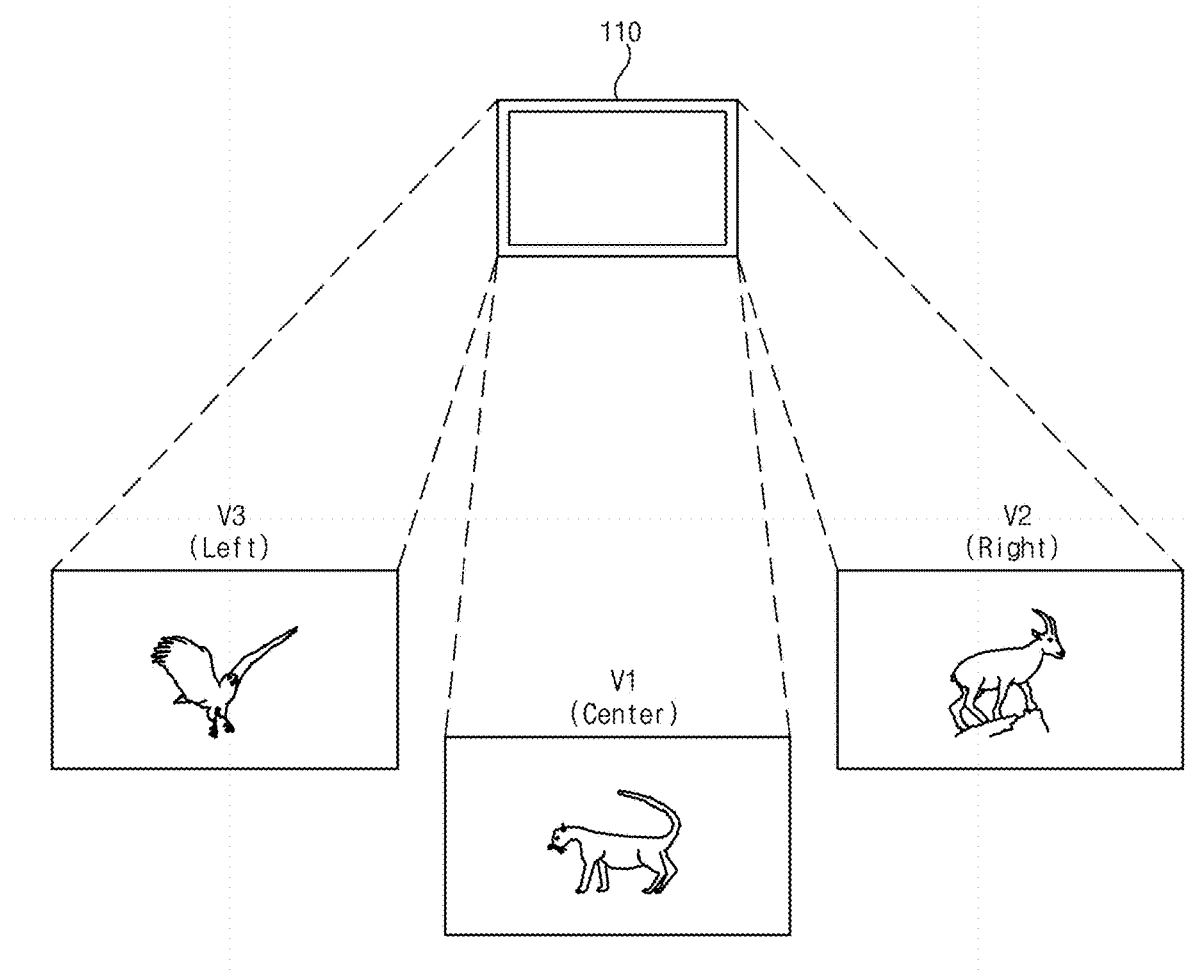
FIG. 2A is a conceptual diagram schematically illustrating a multi-view display device with which images are visible in three different directions according to an embodiment of the present disclosure.
Figure 2B:
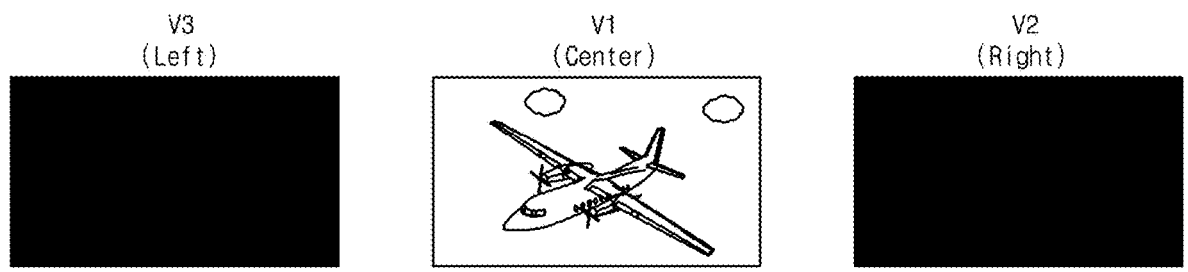
FIG. 2B is a schematic conceptual diagram for describing a privacy protection mode using a multi-view display device according to an embodiment of the present disclosure.

FIG. 2A is a conceptual diagram schematically illustrating a multi-view display device with which images are visible in three different directions according to an embodiment of the present disclosure, and FIG. 2B is a schematic conceptual diagram for describing a privacy protection mode using a multi-view display device according to an embodiment of the present disclosure.

As illustrated in FIG. 2A, the multi-view display device displays two or three different images on a single display panel 110 as a method of controlling a viewing angle.

In other words, different images V1, V2, and V3 are displayed on the center, right, and left portions. In FIG. 2A, a triple-view display device with which different images are visible when the display panel 110 is viewed from the center (V1), viewed from the left at an angle of 50° from the center (V3), and viewed from the right at an angle of 50° from the center (V2) is illustrated as an example.

The multi-view display device simultaneously provides multiple images V1, V2, and V3, which differ from each other according to viewing directions, using the single display panel 110. Light incident from the display panel 110 is divided into the center, left, and right using barriers so that three different images V1, V2, and V3 are simultaneously displayed.

Accordingly, the multi-view display device may be used to watch TV at the center and play game or surf the Internet at the left or right.

The multi-view display device may also be applied as a vehicle navigation device and an advertisement display capable of multi-screen display. For example, in the case of a vehicle navigation device, while a navigation screen is provided to a driver and road information to a destination is displayed to the driver, a screen that allows tour information to be searched for may be displayed to a passenger of a front passenger seat, and a passenger of a back passenger seat may be allowed to watch a digital versatile disc (DVD) movie through a screen.

When the multi-view display device is applied in the advertisement display field, three different pieces of information may be displayed according to directions in which pedestrians walk. Since the multi-view display device is capable of showing different images V1, V2, and V3 to two or more users, the space and cost are significantly saved in comparison to when two or more separate display devices are used.

Although not illustrated, a three-dimensional stereoscopic image may be realized when the multi-view display device is a dual-view display device configured to display two different images.

When images seen by two eyes are different due to binocular disparity, the human brain accurately combines the two pieces of information, and a three-dimensional stereoscopic image is formed. Such a three-dimensional stereoscopic image causes a person to feel a stereoscopic effect.

The multi-view display device may realize a privacy protection mode as illustrated in FIG. 2B. In the privacy protection mode, a private image V1 is only provided to a user who views the display panel 110 from the center, and a user who views the display panel 110 from the left or right views black images or noise images V2 and V3. In this case, the private image V1 is an image that the user wants to keep invisible to others for security or privacy.

Figure 3:
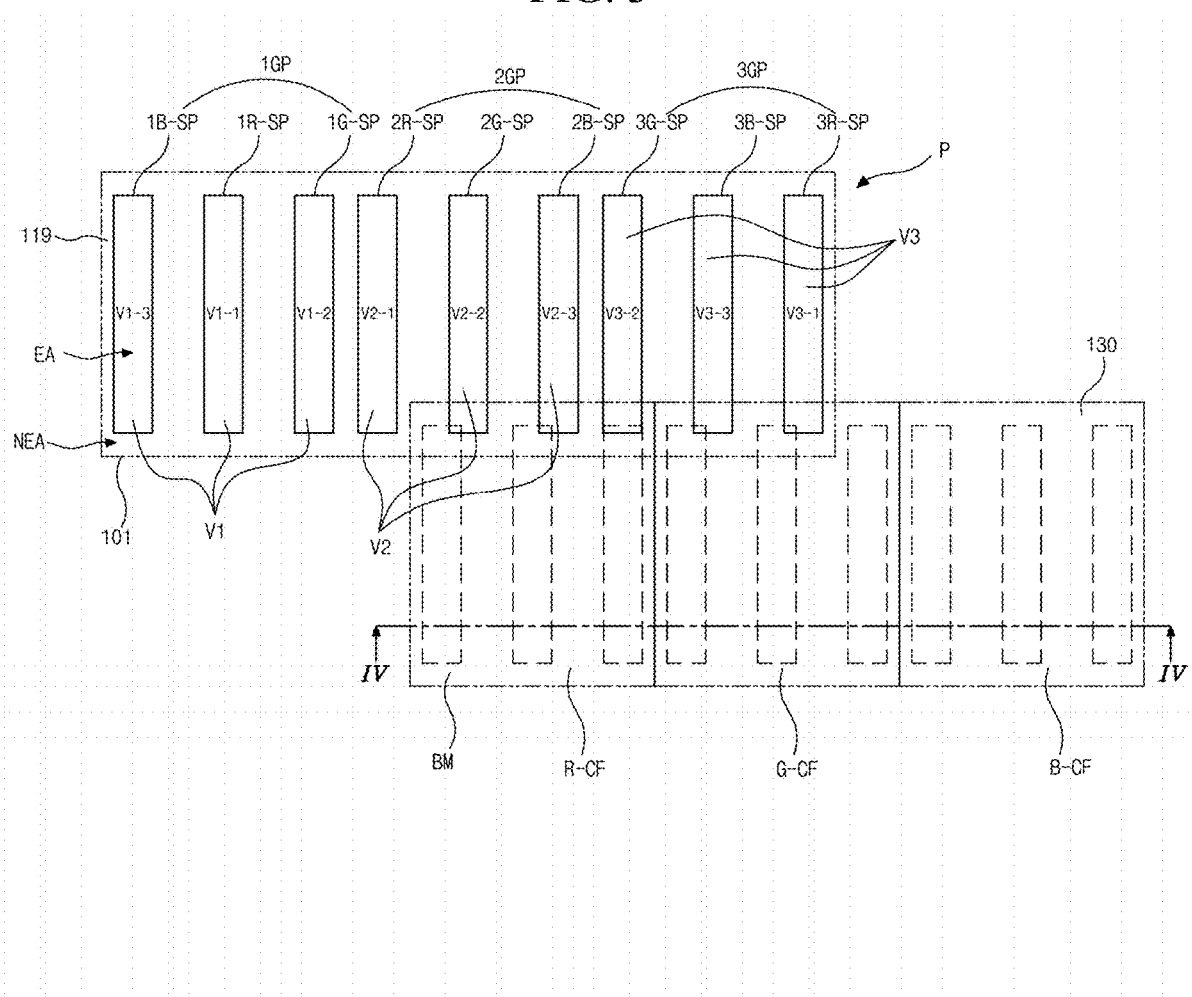
FIG. 3 is a plan view schematically illustrating the arrangement of an array substrate and a color filter encapsulation substrate which constitute a multi-view display device according to an embodiment of the present disclosure.

FIG. 3 is a plan view schematically illustrating an arrangement of an array substrate and a color filter encapsulation substrate which constitute the multi-view display device according to an embodiment of the present disclosure.

In FIG. 3, for convenience of description, only a plurality of subpixels 1R-SP, 1G-SP, 1B-SP, 2R-SP, 2G-SP, 2B-SP, 3R-SP, 3G-SP, and 3B-SP and banks 119 configured to partition the subpixels 1R-SP, 1G-SP, 1B-SP, 2R-SP, 2G-SP, 2B-SP, 3R-SP, 3G-SP, and 3B-SP are illustrated, and only color filters R-CF, G-CF, and B-CF and black matrices BM are illustrated on a color filter encapsulation substrate 130.

As illustrated in FIG. 3, the multi-view display device according to an embodiment of the present disclosure may use an OLED device. The OLED device includes an array substrate 101 including a driving thin film transistor DTr (see FIG. 4) and an LED E (see FIG. 4), and the color filter encapsulation substrate 130 facing the array substrate 101.

In more detail, the plurality of subpixels 1R-SP, 1G-SP, 1B-SP, 2R-SP, 2G-SP, 2B-SP, 3R-SP, 3G-SP, and 3B-SP are arranged as matrices on the array substrate 101. The plurality of subpixels 1R-SP, 1G-SP, 1B-SP, 2R-SP, 2G-SP, 2B-SP, 3R-SP, 3G-SP, and 3B-SP are divided and defined into first to third subpixel groups 1GP, 2GP, and 3GP, and the first to third subpixel groups 1GP, 2GP, and 3GP constitute a single unit pixel P.

The first to third subpixel groups 1GP, 2GP, and 3GP include first to third red subpixels 1R-SP, 2R-SP, and 3R-SP configured to emit red light, first to third green subpixels 1G-SP, 2G-SP, and 3G-SP configured to emit green light, and first to third blue subpixels 1B-SP, 2B-SP, and 3B-SP configured to emit blue light, respectively.

In other words, the first subpixel group 1GP includes the first red subpixel 1R-SP, the first green subpixel 1G-SP, and the first blue subpixel 1B-SP. The second subpixel group 2GP includes the second red subpixel 2R-SP, the second green subpixel 2G-SP, and the second blue subpixel 2B-SP. The third subpixel group 3GP includes the third red subpixel 3R-SP, the third green subpixel 3G-SP, and the third blue subpixel 3B-SP.

All of the first to third red subpixels 1R-SP, 2R-SP, and 3R-SP, the first to third green subpixels 1G-SP, 2G-SP, and 3G-SP, and the first to third blue subpixels 1B-SP, 2B-SP, and 3B-SP constitute a single unit pixel P.

Each of the first to third red, green, and blue subpixels 1R-SP, 1G-SP, 1B-SP, 2R-SP, 2G-SP, 2B-SP, 3R-SP, 3G-SP, and 3B-SP includes an emissive region EA, and the bank 119 is disposed along an edge of each emissive region EA and forms a non-emissive region NEA.

In this case, for convenience of description, the subpixels 1R-SP, 1G-SP, 1B-SP, 2R-SP, 2G-SP, 2B-SP, 3R-SP, 3G-SP, and 3B-SP are illustrated as being disposed in parallel at equal widths. However, the subpixels 1R-SP, 1G-SP, 1B-SP, 2R-SP, 2G-SP, 2B-SP, 3R-SP, 3G-SP, and 3B-SP may be disposed at different widths and have various other structures.

A switching thin film transistor (not illustrated) and a driving thin film transistor DTr (see FIG. 4) are disposed on the non-emissive region NEA of each of the subpixels 1R-SP, 1G-SP, 1B-SP, 2R-SP, 2G-SP, 2B-SP, 3R-SP, 3G-SP, and 3B-SP, and an LED E (see FIG. 4) which includes a first electrode 111 (see FIG. 4), an organic light emitting layer 113 (see FIG. 4), and a second electrode 115 (see FIG. 4) is disposed on the emissive region EA in each of the subpixels 1R-SP, 1G-SP, 1B-SP, 2R-SP, 2G-SP, 2B-SP, 3R-SP, 3G-SP, and 3B-SP.

The first to third subpixel groups 1GP, 2GP, and 3GP may display three view images V1, V2, and V3 using the first to third red, green, and blue subpixels 1R-SP, 1G-SP, 1B-SP, 2R-SP, 2G-SP, 2B-SP, 3R-SP, 3G-SP, and 3B-SP included in the subpixel groups 1GP, 2GP, and 3GP.

In other words, the first subpixel group 1GP may display a first-first (i.e., 1-1) view image V1-1 using the first red subpixel 1R-SP, display a first-second (i.e., 1-2) view image V1-2 using the first green subpixel 1G-SP, and display a first-third (i.e., 1-3) view image V1-3 using the first blue subpixel 1B-SP.

The second subpixel group 2GP and the third subpixel group 3GP may display a second-first (i.e., 2-1) view image V2-1 and a third-first (i.e., 3-1) view image V3-1 using the second red subpixel 2R-SP and the third red subpixel 3R-SP, respectively, display a second-second view image V2-2 (i.e., 2-2) and a third-second (i.e., 3-2) view image V3-2 using the second green subpixel 2G-SP and the third green subpixel 3G-SP, respectively, and display a second-third view image (i.e., 2-3) V2-3 and a third-third (i.e., 3-3) view image V3-3 using the second blue subpixel 2B-SP and the third blue subpixel 3B-SP, respectively.

The first-first view image V1-1 displays a red portion of the first view image V1, the first-second view image V1-2 displays a green portion of the first view image V1, and the first-third view image V1-3 displays a blue portion of the first view image V1. The second-first view image V2-1 displays a red portion of the second view image V2, the second-second view image V2-2 displays a green portion of the second view image V2, and the third-second view image V2-3 displays a blue portion of the second view image V2. The third-first view image V3-1 displays a red portion of the third view image V3, the third-second view image V3-2 displays a green portion of the third view image V3, and the third-third view image V3-3 displays a blue portion of the third view image V3.

In this case, the first-first view image V1-1, the first-second view image V1-2, and the first-third view image V1-3 may display a single first view image V1. The second-first view image V2-1, the second-second view image V2-2, and the second-third view image V2-3 may display a single second view image V2. The third-first view image V3-1, the third-second view image V3-2, and the third-third view image V3-3 may display a single third view image V3.

Accordingly, the single unit pixel P of this embodiment may display three view images of the first to third view images V1, V2, and V3 divided and defined into nine view images.

For this, in the first subpixel group 1GP, the first blue subpixel 1B-SP, the first red subpixel 1R-SP, and the first green subpixel 1G-SP may be disposed in that order in a first direction of FIG. 3. In this case, the first direction may be a longitudinal direction (i.e., length direction) of a gate line (not illustrated).

In the second subpixel group 2GP disposed to neighbor the first subpixel group 1GP, the second red subpixel 2R-SP, the second green subpixel 2G-SP, and the second blue subpixel 2B-SP are disposed in that order. In the third subpixel group 3GP, the third green subpixel 3G-SP, the third blue subpixel 3B-SP, and the third red subpixel 3R-SP are disposed in that order.

A plurality of black matrices BM and a plurality of color filters R-CF, G-CF, and B-CF are disposed on the color filter encapsulation substrate 130. The black matrices BM and the color filters R-CF, G-CF, and B-CF may serve as barriers configured to spatially separate the nine view images.

Regarding the color filters R-CF, G-CF, and B-CF disposed on the color filter encapsulation substrate 130, the red color filter R-CF may be disposed corresponding to the first subpixel group 1GP, the green color filter G-CF may be disposed corresponding to the second subpixel group 2GP, and the blue color filter B-CF may be disposed corresponding to the third subpixel group 3GP.

In other words, the first red, green, and blue subpixels 1R-SP, 1G-SP, and 1B-SP of the first subpixel group 1GP may be disposed to overlap with the red color filter R-CF, the second red, green, and blue subpixels 2R-SP, 2G-SP, and 2B-SP of the second subpixel group 2GP may be disposed to overlap with the green color filter G-CF, and the third red, green, and blue subpixels 3R-SP, 3G-SP, and 3B-SP of the third subpixel group 3GP may be disposed to overlap with the blue color filter B-CF.

Accordingly, by applying different data signals to the first to third subpixels 1R-SP, 1G-SP, 1B-SP, 2R-SP, 2G-SP, 2B-SP, 3R-SP, 3G-SP, and 3B-SP, red light emitted from the first red subpixel 1R-SP of the first subpixel group 1GP passes through the red color filter R-CF disposed at the color filter encapsulation substrate 130 and displays the first-first view image V1-1. However, green light and blue light emitted from the first green subpixel 1G-SP and the first blue subpixel 1B-SP of the first subpixel group 1GP are unable to pass through the red color filter R-CF which is disposed corresponding to the first subpixel group 1GP and, instead, respectively pass through the green color filter G-CF and the blue color filter B-CF, which are disposed corresponding to the second and third subpixel groups 2GP and 3GP disposed to neighbor the first subpixel group 1GP, and display the first-second view image V1-2 and the first-third view image V1-3.

In addition, green light emitted from the second green subpixel 2G-SP of the second subpixel group 2GP passes through the green color filter G-CF disposed at the color filter encapsulation substrate 130 and displays the second-second view image V2-2. However, red light and blue light emitted from the second red subpixel 2R-SP and the second blue subpixel 2B-SP of the second subpixel group 2GP are unable to pass through the green color filter G-CF which is disposed corresponding to the second subpixel group 2GP and, instead, respectively pass through the red color filter R-CF and the blue color filter B-CF, which are disposed corresponding to the first and third subpixel groups 1GP and 3GP disposed to neighbor the second subpixel group 2GP, and display the second-first view image V2-1 and the second-third view image V2-3.

In addition, blue light emitted from the third blue subpixel 3B-SP of the third subpixel group 3GP passes through the blue color filter B-CF disposed at the color filter encapsulation substrate 130 and displays the third-third view image V3-3. However, red light and green light emitted from the third red subpixel 3R-SP and the third green subpixel 3G-SP of the third subpixel group 3GP are unable to pass through the blue color filter B-CF which is disposed corresponding to the third subpixel group 3GP and, instead, respectively pass through the red color filter R-CF and the green color filter G-CF, which are disposed corresponding to the first and second subpixel groups 1GP and 2GP disposed to neighbor the third subpixel group 3GP, and display the third-first view image V3-1 and the third-third view image V3-3.

In this case, the first-first view image V1-1 displayed through the red color filter R-CF, the first-second view image V1-2 displayed through the green color filter G-CF, and the first-third view image V1-3 displayed through the blue color filter B-CF realize the first view image V1. The second-first view image V2-1, the second-second view image V2-2, and the second-third view image V2-3 realize the second view image V2. The third-first view image V3-1, the third-second view image V3-2, and the third-third view image V3-3 realize the single third view image V3. Accordingly, the OLED device of this embodiment realizes the multi-view display device.

The first-second view image V1-2, the first-third view image V1-3, the second-first view image V2-1, the second-third view image V2-3, the third-first view image V3-1, and the third-second view image V3-2, which are unable to pass through the color filters R-CF, G-CF, and B-CF disposed corresponding to the first to third subpixel groups 1GP, 2GP, and 3GP, respectively, and, instead, pass through other color filters R-CF, G-CF, and B-CF disposed corresponding to the neighboring subpixel groups 1GP, 2GP, and 3GP, are formed due to transmission of light emitted sideward from each of the subpixels 1R-SP, 1G-SP, 1B-SP, 2R-SP, 2G-SP, 2B-SP, 3R-SP, 3G-SP, and 3B-SP. Accordingly, the first-second view image V1-2, the first-third view image V1-3, the second-first view image V2-1, the second-third view image V2-3, the third-first view image V3-1, and the third-second view image V3-2 have a lower luminance in comparison to the first-first view image V1-1, the second-second view image V2-2, and the third-third view image V3-3 which pass through the color filters R-CF, G-CF, and B-CF disposed corresponding to the first to third subpixel groups 1GP, 2GP, and 3GP, respectively.

In this case, in the OLED device according to an embodiment of the present disclosure, by respectively disposing bank patterns 200a, 200b, and 200c (see FIG. 4) further below the first electrodes 111 (see FIG. 4) of the LEDs E (see FIG. 4), the first-second view image V1-2, the first-third view image V1-3, the second-first view image V2-1, the second-third view image V2-3, the third-first view image V3-1, and the third-second view image V3-2 may be formed due to transmission of light emitted forward from each of the subpixels 1R-SP, 1G-SP, 1B-SP, 2R-SP, 2G-SP, 2B-SP, 3R-SP, 3G-SP, and 3B-SP. Accordingly, it is possible to realize uniform high luminance in all multi-view images.

This will be described in more detail with reference to FIGS. 4 and 5.

Figure 4:
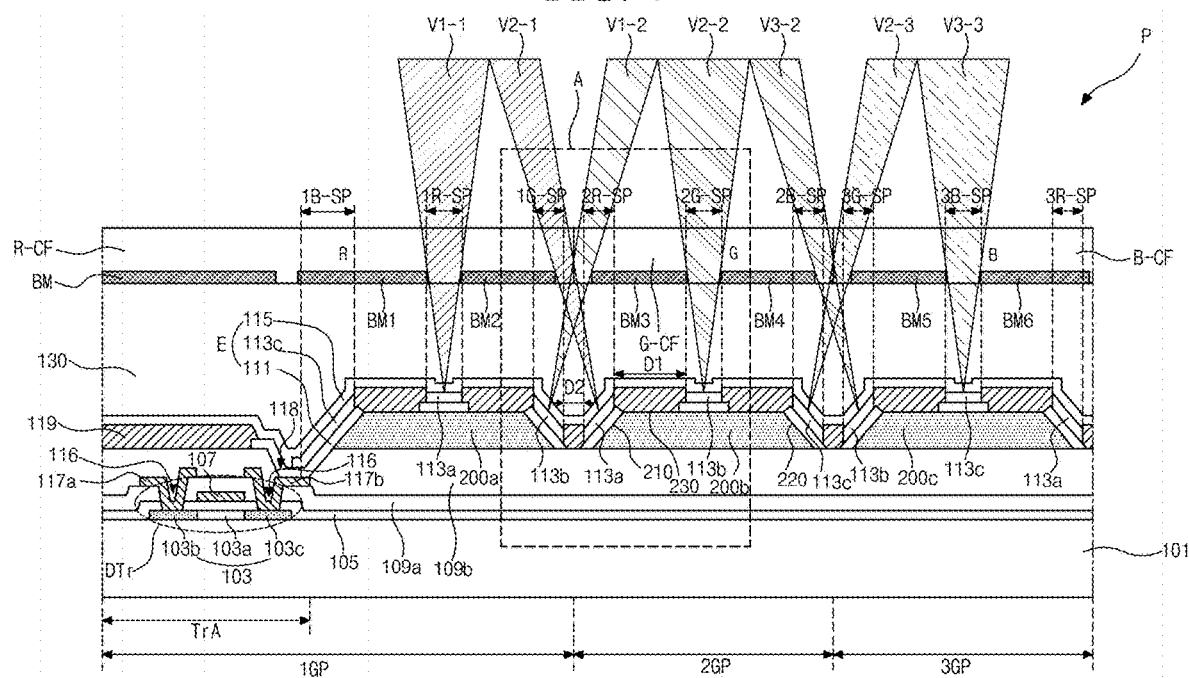
FIG. 4 is a cross-sectional view taken along line IV-IV of FIG. 3 according to an embodiment of the present disclosure.
Figure 5:
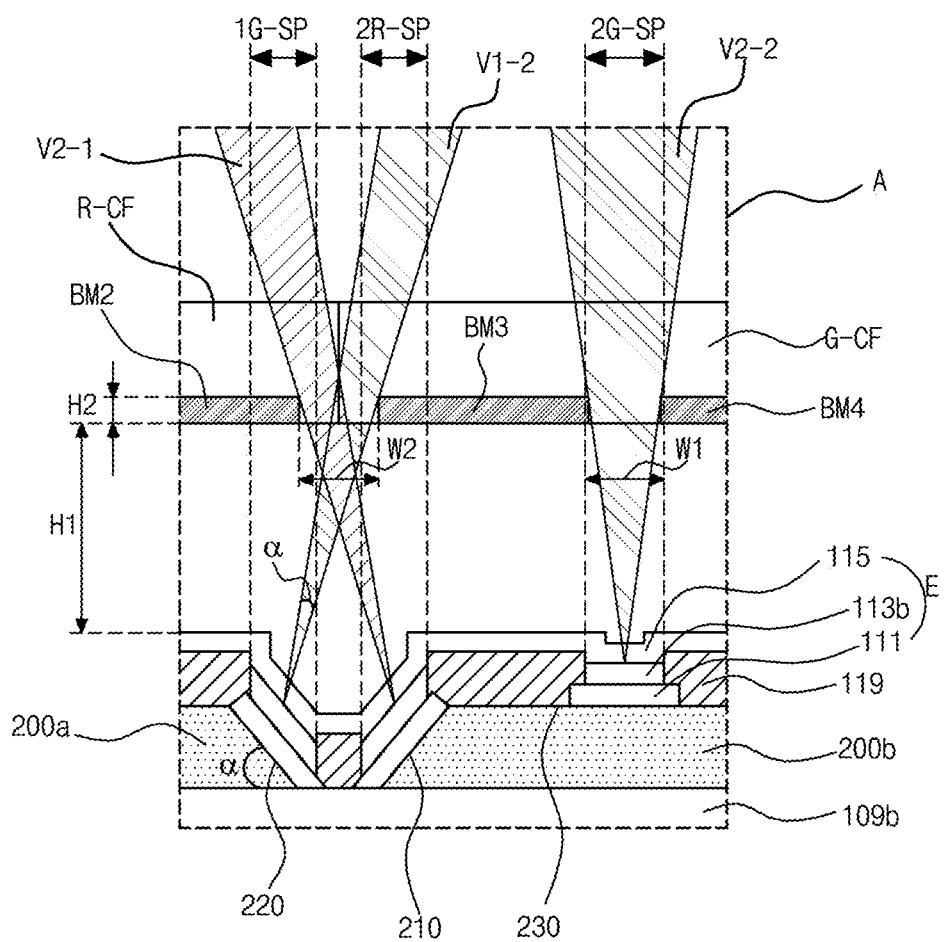
FIG. 5 is an enlarged view of portion A of FIG. 4 according to an embodiment of the present disclosure.

FIG. 4 is a cross-sectional view taken along line IV-IV of FIG. 3, and FIG. 5 is an enlarged view of portion A of FIG. 4.

Figure 6A:
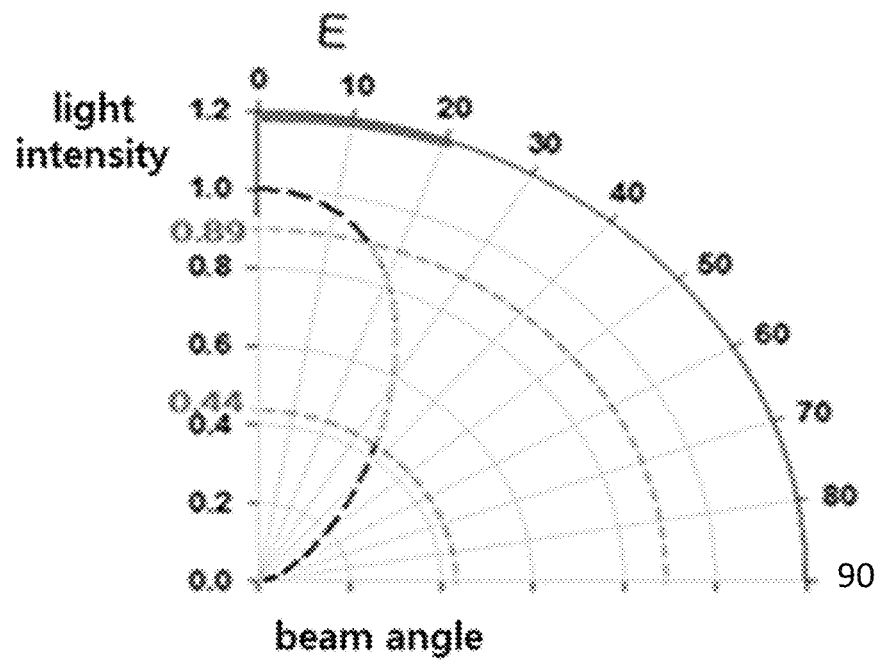
FIGS. 6A to 6C are graphs of experimental results showing beam angles of light emitted from subpixels according to an embodiment of the present disclosure.
Figure 6B:
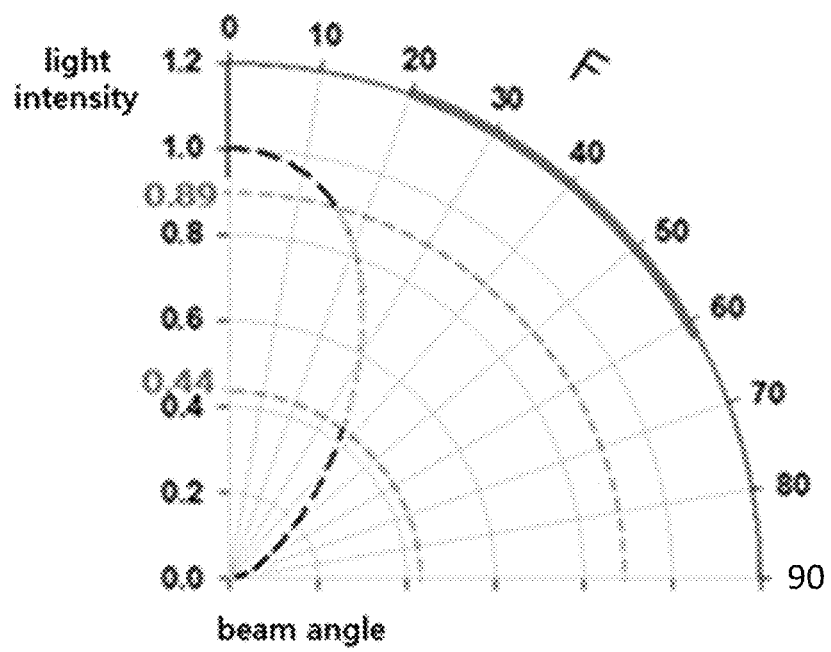
Figure 6C:
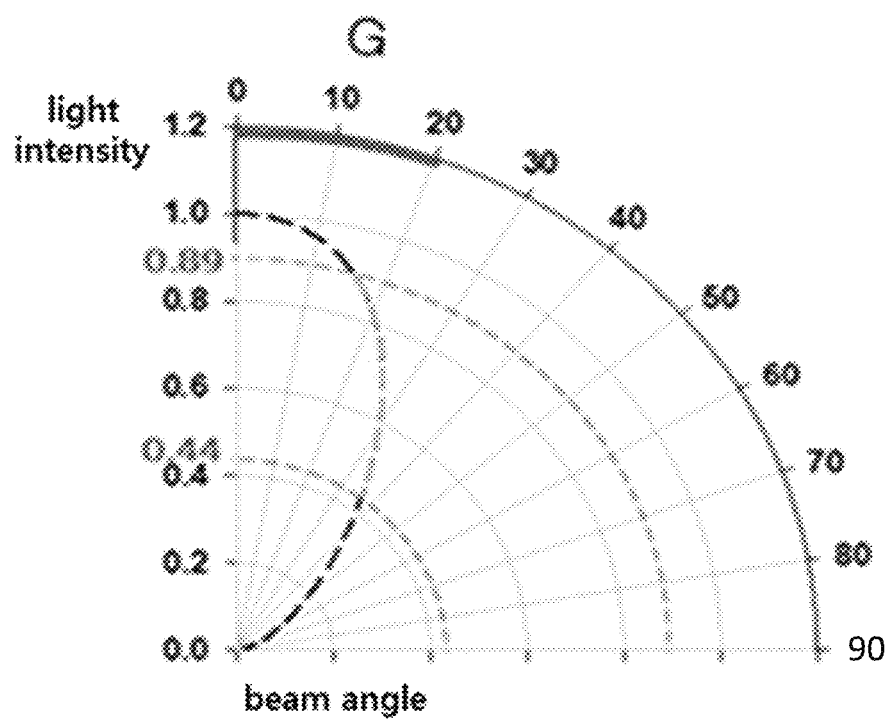

FIGS. 6A to 6C are graphs of experimental results showing beam angles of light emitted from subpixels.

The OLED device according to an embodiment of the present disclosure is classified into a top emission type and a bottom emission type according to a light transmission direction. Hereinafter, an example in which the OLED device is a top emission type will be described.

As illustrated in FIG. 4, the OLED device according to an embodiment of the present disclosure includes an array substrate 101 on which a driving thin film transistor DTr and an LED E are formed, and a color filter encapsulation substrate 130 facing the array substrate 101. The array substrate 101 and the color filter encapsulation substrate 130 are adhered to each other, thereby forming the OLED device.

In more detail, a gate line (not illustrated), a data line (not illustrated), and a power line (not illustrated) are disposed on the array substrate 101 such that each of the subpixels 1R-SP, 1G-SP, 1B-SP, 2R-SP, 2G-SP, 2B-SP, 3R-SP, 3G-SP, and 3B-SP is defined.

In this case, the plurality of subpixels 1R-SP, 1G-SP, 1B-SP, 2R-SP, 2G-SP, 2B-SP, 3R-SP, 3G-SP, and 3B-SP may be divided and defined into first to third subpixel groups 1GP, 2GP, and 3GP. The first to third subpixel groups 1GP, 2GP, and 3GP constitute a single unit pixel P.

A semiconductor layer 103 is disposed on a switching region TrA of each of the subpixels 1R-SP, 1G-SP, 1B-SP, 2R-SP, 2G-SP, 2B-SP, 3R-SP, 3G-SP, and 3B-SP on the array substrate 101. The semiconductor layer 103 may be formed of silicon. The semiconductor layer 103 may include an active region 103a as a channel at a center portion thereof, and source and drain regions 103b and 103c doped with high-concentration impurities at both sides of the active region 103a.

A gate insulating layer 105 is disposed on the semiconductor layer 103.

A gate electrode 107 corresponding to the active region 103a of the semiconductor layer 103 and a gate line (not illustrated) which extends in one direction are disposed on the gate insulating layer 105.

An interlayer insulating layer 109a is disposed on the gate electrode 107 and the gate line (not illustrated). In this case, first and second semiconductor layer contact holes 116 configured to respectively expose the source and drain regions 103b and 103c are disposed in the interlayer insulating layer 109a and the gate insulating layer 105.

Source and drain electrodes 117a and 117b spaced apart from each other and configured to respectively be in contact with the source and drain regions 103b and 103c through the first and second semiconductor layer contact holes 116 are disposed on the interlayer insulating layer 109a.

A passivation layer 109b having a drain contact hole 118 configured to expose the drain electrode 117b of the driving thin film transistor DTr is disposed on the source and drain electrodes 117a and 117b and the interlayer insulating layer 109a.

In this case, the source and drain electrodes 117a and 117b, the semiconductor layer 103, the gate insulating layer 105, and the gate electrode 107 constitute the driving thin film transistor DTr.

Although not illustrated in the drawings, a switching thin film transistor is connected to the driving thin film transistor DTr. The switching thin film transistor may be formed of the same structure as the driving thin film transistor DTr.

In this embodiment, the driving thin film transistor DTr having a top gate structure with the semiconductor layer 103 formed as a polycrystalline silicon layer or oxide semiconductor layer is described by way of example. Alternatively, the driving thin film transistor DTr may have a bottom gate structure with the semiconductor layer 103 formed as an amorphous silicon layer.

When the semiconductor layer 103 is formed as the oxide semiconductor layer, a light shielding layer (not illustrated) may be disposed below the semiconductor layer 103. A buffer layer (not illustrated) may be disposed between the light shielding layer and the semiconductor layer 103.

The first to third bank patterns 200a, 200b, and 200c are disposed on the passivation layer 109b. The first to third bank patterns 200a, 200b, and 200c may be disposed to be spaced apart at predetermined gaps corresponding to the first to third subpixel groups 1GP, 2GP, and 3GP. Each of the first to third bank patterns 200a, 200b, and 200c may include first and second inclined surfaces 210 and 220 and a flat surface 230 configured to connect the first and second inclined surfaces 210 and 220. The first and second inclined surface 210 and 220 are slanted with respect to a top surface of the array substrate 101. The first and second inclined surface 210 and 220 may be slanted in different directions from each other.

In this case, the first inclined surface 210 of the first bank pattern 200a may be disposed corresponding to the first blue subpixel 1B-SP of the first subpixel group 1GP, the flat surface 230 of the first bank pattern 200a may be disposed corresponding to the first red subpixel 1R-SP of the first subpixel group 1GP, and the second inclined surface 220 of the first bank pattern 200a may be disposed corresponding to the first green subpixel 1G-SP of the first subpixel group 1GP.

The first and second inclined surfaces 210 and 220 of the second bank pattern 200b may be disposed respectively corresponding to the second red subpixel 2R-SP and the second blue subpixel 2B-SP of the second subpixel group 2GP, and the flat surface 230 of the second bank pattern 200b may be disposed corresponding to the second green subpixel 2G-SP of the second subpixel group 2GP. The first and second inclined surfaces 210 and 220 of the third bank pattern 200c may be disposed respectively corresponding to the third green subpixel 3G-SP and the third red subpixel 3R-SP of the third subpixel group 3GP, and the flat surface 230 of the third bank pattern 200c may be disposed corresponding to the third blue subpixel 3B-SP of the third subpixel group 3GP.

In this way, in the OLED device according to an embodiment of the present disclosure, all of subpixels 1R-SP, 1G-SP, 1B-SP, 2R-SP, 2G-SP, 2B-SP, 3R-SP, 3G-SP, and 3B-SP of the first to third subpixel groups 1GP, 2GP, and 3GP may emit light forward and be able to realize uniform high luminance. This will be described in more detail below.

First electrodes 111 each connected to the drain electrode 117b of the driving thin film transistor DTr and serving as an anode of the LED E with, for example, a material having a relatively high work function, may be disposed on the first to third bank patterns 200a, 200b, and 200c with the passivation layer 109b.

The first electrode 111 may be formed of metal oxide such as indium tin oxide (ITO) or indium zinc oxide (IZO).

The first electrode 111 may be disposed for each of the subpixels 1R-SP, 1G-SP, 1B-SP, 2R-SP, 2G-SP, 2B-SP, 3R-SP, 3G-SP, and 3B-SP. The first electrode 111 of the first blue subpixel 1B-SP of the first subpixel group 1GP is disposed on the first inclined surface 210 of the first bank pattern 200a, the first electrode 111 of the first red subpixel 1R-SP is disposed on the flat surface 230 of the first bank pattern 200a, and the first electrode 111 of the first green subpixel 1G-SP is disposed on the second inclined surface 220 of the first bank pattern 200a.

The first electrode 111 of the second red subpixel 2R-SP of the second subpixel group 2GP is disposed on the first inclined surface 210 of the second bank pattern 200b, the first electrode 111 of the second green subpixel 2G-SP is disposed on the flat surface 230 of the second bank pattern 200b, and the first electrode 111 of the second blue subpixel 2B-SP is disposed on the second inclined surface 220 of the second bank pattern 200b. The first electrode 111 of the third green subpixel 3G-SP of the third subpixel group 3GP is disposed on the first inclined surface 210 of the third bank pattern 200c, the first electrode 111 of the third blue subpixel 3B-SP is disposed on the flat surface 230 of the third bank pattern 200c, and the first electrode 111 of the third red subpixel 3R-SP is disposed on the second inclined surface 220 of the third bank pattern 200c.

Banks 119 are disposed between the first electrodes 111 disposed for each of the subpixels 1R-SP, 1G-SP, 1B-SP, 2R-SP, 2G-SP, 2B-SP, 3R-SP, 3G-SP, and 3B-SP. In other words, the first electrodes 111 may have separated structures for each of the subpixels 1R-SP, 1G-SP, 1B-SP, 2R-SP, 2G-SP, 2B-SP, 3R-SP, 3G-SP, and 3B-SP with the banks 119 as boundaries for each of the subpixels 1R-SP, 1G-SP, 1B-SP, 2R-SP, 2G-SP, 2B-SP, 3R-SP, 3G-SP, and 3B-SP. The banks 119 are disposed between each of the subpixels 1R-SP, 1G-SP, 1B-SP, 2R-SP, 2G-SP, 2B-SP, 3R-SP, 3G-SP, and 3B-SP and are configured to separate organic light emitting layers of the adjacent subpixels.

In this case, a width D2 of the banks 119, which are disposed between the subpixels 1G-SP, 1B-SP, 2R-SP, 2B-SP, 3R-SP, and 3G-SP disposed on the first and second inclined surfaces 210 and 220 of the first to third bank patterns 200a, 200b, and 200c, may be narrower than a width D1 of the banks 119, which are disposed between the subpixels 1G-SP, 1B-SP, 2R-SP, 2B-SP, 3R-SP, and 3G-SP on the first and second inclined surfaces 210 and 220, and the subpixels 1R-SP, 2G-SP, and 3B-SP on the flat surface 230.

In other words, a width D1 of a bank 119 between the first red subpixel 1R-SP and the first green subpixel 1G-SP of the first subpixel group 1GP may be wider than a width D2 of a bank 119 between the first green subpixel 1G-SP and the second red subpixel 2R-SP of the second subpixel group 2GP disposed to neighbor the first green subpixel 1G-SP.

In this case, the widths D1 and D2 of the banks 119 may be changed by varying a distance between the array substrate 101 and the color filter encapsulation substrate 130.

An organic light emitting layer 113 is disposed on the first electrodes 111 with the banks 119. Organic light emitting layers 113a, 113b, and 113c emit red light, green light, and blue light for the respective subpixels 1R-SP, 1G-SP, 1B-SP, 2R-SP, 2G-SP, 2B-SP, 3R-SP, 3G-SP, and 3B-SP of the first to third subpixel groups 1GP, 2GP, and 3GP.

In this regard, the organic light emitting layer 113c disposed in the first blue subpixel 1B-SP of the first subpixel group 1GP emits blue light, the organic light emitting layer 113a disposed in the first red subpixel 1R-SP emits red light, and the organic light emitting layer 113b disposed in the first green subpixel 1G-SP emits green light.

The organic light emitting layer 113a disposed in the second red subpixel 2R-SP of the second subpixel group 2GP emits red light, the organic light emitting layer 113b disposed in the second green subpixel 2G-SP emits green light, and the organic light emitting layer 113c disposed in the second blue subpixel 2B-SP emits blue light. The organic light emitting layer 113b disposed in the third green subpixel 3G-SP of the third subpixel group 3GP emits green light, the organic light emitting layer 113c disposed in the third blue subpixel 3B-SP emits blue light, and the organic light emitting layer 113a disposed in the third red subpixel 3R-SP emits red light.

In other words, the organic light emitting layers disposed in the first to third red subpixels 1R-SP, 2R-SP, and 3R-SP of the first to third subpixel groups 1GP, 2GP, and 3GP are formed of the first organic light emitting layer 113a configured to emit red light, the organic light emitting layers disposed in the first to third green subpixels 1G-SP, 2G-SP, and 3G-SP are formed of the second organic light emitting layer 113b configured to emit green light, and the organic light emitting layers disposed in the first to third blue subpixels 1B-SP, 2B-SP, and 3B-SP are formed of the third organic light emitting layer 113c configured to emit blue light.

In this case, the organic light emitting layers 113a, 113b, and 113c disposed for the respective subpixels 1R-SP, 1G-SP, 1B-SP, 2R-SP, 2G-SP, 2B-SP, 3R-SP, 3G-SP, and 3B-SP may be deposited using a fine metal mask (FMM).

The first to third organic light emitting layers 113a, 113b, and 113c may be formed of a single layer formed of an emitting material. To improve luminous efficiency, the first to third organic light emitting layers 113a, 113b, and 113c may be formed of multiple layers including a hole injection layer, a hole transport layer, an emitting material layer, an electron transport layer, and an electron injection layer.

A second electrode 115 serving as a cathode may be disposed entirely on the organic light emitting layers 113a, 113b, and 113c.

The second electrode 115 may be formed of a material having a relatively low work function. The second electrode 115 may be formed with a single layer or multiple layers using a first metal such as Ag and a second metal such as Mg, and the single layer may be made of an alloy of the first and second metals at a predetermined ratio thereof.

In the OLED device, when predetermined voltages are applied to the first electrode 111 and the second electrode 115, the holes injected from the first electrode 111 and the electrons provided from the second electrode 115 are transported to the organic light emitting layers 113a, 113b, and 113c and form excitons, and when such excitons are transitioned from an excited state to a ground state, light is generated and emitted in the form of visible light.

The OLED device according to an embodiment of the present disclosure is a top emission type in which light emitted from the organic light emitting layers 113a, 113b, and 113c is output to the outside through the second electrode 115. In this case, the first electrode 111 further includes a reflective layer (not illustrated) formed of an opaque conductive material. For example, the reflective layer may be formed of an aluminum-palladium-copper (APC) alloy, and the first electrode 111 may have a triple layer structure of ITO/APC/ITO.

The second electrode 115 may be formed of a semi-transmissive conductive material such as Mg, Ag, or an alloy of Mg and Ag. When the second electrode 115 is formed of a semi-transmissive conductive material, light output efficiency may be improved by a micro cavity.

A capping layer (not illustrated) may be formed on the second electrode 115.

The color filter encapsulation substrate 130, which is in the form of a thin film, is formed on the driving thin film transistor DTr and the LED E, and the OLED device is encapsulated by the color filter encapsulation substrate 130.

To prevent permeation of external oxygen and moisture into the OLED device, at least two inorganic protective films are stacked to form the color filter encapsulation substrate 130. In this case, an organic protective film for supplementing impact resistance of the two inorganic protective films may be preferably interposed between the inorganic protective films.

In such the structure in which the organic protective film and the inorganic protective films are alternately stacked repeatedly, in order to prevent moisture and oxygen from permeating through side surfaces of the organic protective film, the inorganic protective films may completely cover the organic protective film.

Accordingly, the OLED device may prevent permeation of moisture and oxygen thereinto from the outside.

In this case, in the OLED device according to an embodiment of the present disclosure, the first to third color filters R-CF, G-CF, and B-CF and a barrier layer including black matrices BM1, BM2, BM3, BM4, BM5, and BM6 are disposed on the color filter encapsulation substrate 130. Each of the black matrices BM1, BM2, BM3, BM4, BM5, and BM6 are spaced apart from an adjacent black matrix. The black matrices BM1, BM2, BM3, BM4, BM5, and BM6 are configured to pass portions of emitted colored light from subpixels 1R-SP, 1G-SP, 1B-SP, 2R-SP, 2G-SP, 2B-SP, 3R-SP, 3G-SP, and 3B-SP through a gap between adjacent black matrices while blocking other portions of the emitted colored light. Among the first blue, red, and green subpixels 1B-SP, 1R-SP, and 1G-SP of the first subpixel group 1GP, the black matrices BM1, BM2, BM3, BM4, BM5, and BM6 may not overlap with the first red subpixel 1R-SP disposed at the center of the first subpixel group 1GP, and may overlap by half with the first green subpixel 1G-SP and the first blue subpixel 1B-SP.

In other words, the first and second black matrices BM1 and BM2 may be disposed in the first subpixel group 1GP. One end of the first black matrix BM1 may correspond to a central portion of the first blue subpixel 1B-SP, and the other end of the first black matrix BM1 may correspond to one end of the first red subpixel 1R-SP.

The second black matrix BM2 may be disposed to be spaced apart from the first black matrix BM1 by a gap corresponding to a width of the first red subpixel 1R-SP. Accordingly, one end of the second black matrix BM2 may correspond to the other end of the first red subpixel 1R-SP, and the other end of the second black matrix BM2 may be disposed corresponding to a central portion of the first green subpixel 1G-SP.

The third and fourth black matrices BM3 and BM4 may be disposed in the second subpixel group 2GP which is disposed to neighbor the first subpixel group 1GP. One end of the third black matrix BM3 may correspond to a central portion of the second red subpixel 2R-SP, and the other end of the third black matrix BM3 may correspond to one end of the second green subpixel 2G-SP.

Accordingly, the second black matrix BM2 and the third black matrix BM3 may be disposed to be spaced apart by a gap (=transmission portion) corresponding to ½ of a width of the first green subpixel 1G-SP of the first subpixel group 1GP and ½ of a width of the second red subpixel 2R-SP of the second subpixel group 2GP.

The fourth black matrix BM4 may be disposed to be spaced apart from the third black matrix BM3 by a gap (=transmission portion) corresponding to a width of the second green subpixel 2G-SP. Accordingly, one end of the fourth black matrix BM4 may correspond to the other end of the second green subpixel 2G-SP, and the other end of the fourth black matrix BM4 may be disposed corresponding to a central portion of the second blue subpixel 2B-SP.

In addition, the fifth and sixth black matrices BM5 and BM6 may be disposed in the third subpixel group 3GP which is disposed to neighbor the second subpixel group 2GP. One end of the fifth black matrix BM5 may be disposed corresponding to a central portion of the third green subpixel 3G-SP, and the other end of the fifth black matrix BM5 may be disposed corresponding to one end of the third blue subpixel 3B-SP. One end of the sixth black matrix BM6 may be disposed corresponding to the other end of the third blue subpixel 3B-SP, and the other end of the sixth black matrix BM6 may be disposed corresponding to a central portion of the third red subpixel 3R-SP.

Accordingly, the fourth black matrix BM4 and the fifth black matrix BM5 may be disposed to be spaced apart from each other by a gap (=transmission portion) corresponding to ½ of a width of the second blue subpixel 2B-SP of the second subpixel group 2GP and ½ of a width of the third green subpixel 3G-SP of the third subpixel group 3GP. The fifth black matrix BM5 and the sixth black matrix BM6 may be disposed to be spaced apart at a gap (=transmission portion) corresponding to a width of the third blue subpixel 3B-SP.

Preferably, widths of the first to sixth black matrices BM1, BM2, BM3, BM4, BM5, and BM6 may have a value equal to (width of each subpixel 1R-SP, 1G-SP, 1B-SP, 2R-SP, 2G-SP, 2B-SP, 3R-SP, 3G-SP, and 3B-SP*0.5). When the widths of the first to sixth black matrices BM1, BM2, BM3, BM4, BM5, and BM6 have a value less than (width of each subpixel 1R-SP, 1G-SP, 1B-SP, 2R-SP, 2G-SP, 2B-SP, 3R-SP, 3G-SP, and 3B-SP*0.5), light may be mixed and output to neighboring subpixel groups 1GP, 2GP, and 3GP, and it may become difficult for the OLED device to realize multiple views.

The widths of the subpixels 1R-SP, 1G-SP, 1B-SP, 2R-SP, 2G-SP, 2B-SP, 3R-SP, 3G-SP, and 3B-SP and the widths of the black matrices BM1, BM2, BM3, BM4, BM5, and BM6 may be changed by varying the distance between the array substrate 101 and the color filter encapsulation substrate 130.

Regarding the color filters R-CF, G-CF, and B-CF on the color filter encapsulation substrate 130, the red color filter R-CF is disposed corresponding to the first subpixel group 1GP, the green color filter G-CF is disposed corresponding to the second subpixel group 2GP, and the blue color filter B-CF is disposed corresponding to the third subpixel group 3GP.

In other words, the first red, green, and blue subpixels 1R-SP, 1G-SP, and 1B-SP of the first subpixel group 1GP are disposed to overlap with the red color filter R-CF. The red, green, and blue subpixels 2R-SP, 2G-SP, and 2B-SP of the second subpixel group 2GP are disposed to overlap with the green color filter G-CF. The red, green, and blue subpixels 3R-SP, 3G-SP, and 3B-SP of the third subpixel group 3GP are disposed to overlap the blue color filter B-CF.

Accordingly, the subpixels 1B-SP, 1G-SP, 2R-SP, 2B-SP, 3G-SP, and 3R-SP disposed at outermost portions of the first to third subpixel groups 1GP, 2GP, and 3GP on the array substrate 101 may have the same color as the color filters R-CF, G-CF, and B-CF disposed corresponding to the neighboring subpixel groups 1GP, 2GP, and 3GP.

In other words, the first green subpixel 1G-SP disposed at the right outermost portion of the first subpixel group 1GP may emit the same colored light as the green color filter G-CF disposed corresponding to the neighboring second subpixel group 2GP, and the second red subpixel 2R-SP disposed at the left outermost portion of the second subpixel group 2GP may emit the same colored light as the red color filter R-CF disposed corresponding to the neighboring first subpixel group 1GP.

In addition, the second blue subpixel 2B-SP disposed at the right outermost portion of the second subpixel group 2GP may emit the same colored light as the blue color filter B-CF disposed corresponding to the neighboring third subpixel group 3GP, and the third green subpixel 3G-SP disposed at the left outermost portion of the third subpixel group 3GP may emit the same colored light as the green color filter G-CF disposed corresponding to the neighboring second subpixel group 2GP.

In this case, the red, green, and blue color filters R-CF, G-CF, and B-CF have light transmission wavelength bands, which differ from each other, and do not overlap.

In more detail, each of the color filters R-CF, G-CF, and B-CF only transmits light having a specific wavelength and absorbs light having other wavelengths. In this case, red light emitted from the first to third red subpixels 1R-SP, 2R-SP, and 3R-SP of the first to third subpixel groups 1GP, 2GP, and 3GP passes through the red color filter R-CF but is unable to pass through the green color filter G-CF and the blue color filter B-CF.

In addition, green light emitted from the first to third green subpixels 1G-SP, 2G-SP, and 3G-SP passes through the green color filter G-CF but is unable to pass through the red color filter R-CF and the blue color filter B-CF. Blue light emitted from the first to third blue subpixels 1B-SP, 2B-SP, and 3B-SP passes through the blue color filter B-CF but is unable to pass through the red color filter R-CF and the green color filter G-CF.

Accordingly, red light emitted from the first red subpixel 1R-SP of the first subpixel group 1GP passes through the transmission portion between the first black matrix BM1 and the second black matrix BM2 then passes through the red color filter R-CF disposed at the color filter encapsulation substrate 130, and displays the first-first view image V1-1.

Green light emitted from the first green subpixel 1G-SP of the first subpixel group 1GP travels toward the red color filter R-CF, which is disposed corresponding to the first subpixel group 1GP, and the green color filter G-CF, which is disposed corresponding to the second subpixel group 2GP, via the transmission portion between the second black matrix BM2 and the third black matrix BM3. However, the green light emitted from the first green subpixel 1G-SP is unable to pass through the red color filter R-CF corresponding to the first subpixel group 1GP and only passes through the green color filter G-CF corresponding to the second subpixel group 2GP.

Accordingly, the green light emitted from the first green subpixel 1G-SP of the first subpixel group 1GP only displays the first-second view image V1-2. Although not illustrated, blue light emitted from the first blue subpixel 1B-SP of the first subpixel group 1GP passes through a blue color filter of a neighboring subpixel group and only displays the first-third view image V1-3 (see FIG. 3).

Green light emitted from the second green subpixel 2G-SP of the second subpixel group 2GP passes through the green color filter G-CF disposed at the color filter encapsulation substrate 130 and displays the second-second view image V2-2. However, red light and blue light emitted from the second red subpixel 2R-SP and the second blue subpixel 2B-SP of the second subpixel group 2GP are unable to pass through the green color filter G-CF disposed corresponding to the second subpixel group 2GP and, instead, respectively pass through the red color filter R-CF and the blue color filter B-CF disposed corresponding to the neighboring first and third subpixel groups 1GP and 3GP and display the second-first view image V2-1 and the second-third view image V2-3.

Blue light emitted from the third blue subpixel 3B-SP of the third subpixel group 3GP passes through the blue color filter B-CF disposed at the color filter encapsulation substrate 130 and displays the third-third view image V3-3. However, red light and green light emitted from the third red subpixel 3R-SP and the third green subpixel 3G-SP of the third subpixel group 3GP are unable to pass through the blue color filter B-CF disposed corresponding to the third subpixel group 3GP and, instead, respectively pass through the red color filter R-CF and the green color filter G-CF disposed corresponding to the neighboring first and second subpixel groups 1GP and 2GP and display the third-first view image V3-1 and the third-second view image V3-2.

In this case, the first-first view image V1-1 displayed through the red color filter R-CF, the first-second view image V1-2 displayed through the green color filter G-CF, and the first-third view image V1-3 displayed through the blue color filter B-CF realize the first view image V1. The second-first view image V2-1, the second-second view image V2-2, and the second-third view image V2-3 realize the second view image V2. The third-first view image V3-1, the third-second view image V3-2, and the third-third view image V3-3 realize the third view image V3.

Accordingly, the OLED device of this embodiment realizes the multi-view display device.

In other words, in the OLED according to this embodiment, in addition to the subpixels 1R-SP, 1G-SP, 1B-SP, 2R-SP, 2G-SP, 2B-SP, 3R-SP, 3G-SP, and 3B-SP and the color filters R-CF, G-CF, and B-CF being used, the gaps between the subpixels 1R-SP, 1G-SP, 1B-SP, 2R-SP, 2G-SP, 2B-SP, 3R-SP, 3G-SP, and 3B-SP are adjusted, and the black matrices BM1, BM2, BM3, BM4, BM5, and BM6 are disposed. Accordingly, the first-first view image V1-1 displayed from the first red subpixel 1R-SP is output to a region of the first view image V1, and the first-second view image V1-2 displayed from the first green subpixel 1G-SP is also output to the region of the first view image V1.

The second-first view image V2-1 displayed from the second red subpixel 2R-SP is output to a region of the second view image V2, the second-second view image V2-2 displayed from the second green subpixel 2G-SP is also output to the region of the second view image V2, and the second-third view image V2-3 displayed from the second blue subpixel 2B-SP is also output to the region of the second view image V2. The third-second view image V3-2 displayed from the third green subpixel 3G-SP is output to a region of the third view image V3, and the third-third view image V3-3 displayed from the third blue subpixel 3B-SP is also output to the region of the third view image V3.

The first-third view image V1-3 displayed from the first blue subpixel 1B-SP is output to the region of the first view image V1, and the third-first view image V3-1 displayed from the third red subpixel 3R-SP is output to the region of the third view image V3.

This means that each of the first-first to first-third view images V1-1, V1-2, and V1-3 may be output to the region of the first view image V1 using the first red, green, and blue subpixels 1R-SP, 1G-SP, and 1B-SP, the second-first to second-third view images V2-1, V2-2, and V2-3 may be output to the region of the second view image V2 using the second red, green, and blue subpixels 2R-SP, 2G-SP, and 2B-SP, and the third-first to third-third view images V3-1, V3-2, and V3-3 may be output to the region of the third view region V3 using the third red, green, and blue subpixels 3R-SP, 3G-SP, and 3B-SP.

Accordingly, since the OLED device according to an embodiment of the present disclosure may realize multiple views, a triple-view display device may be realized using a single display device, and a three-dimensional stereoscopic image may also be realized using a single display device.

In addition, since a privacy protection mode may be realized, one's privacy or information may be protected.

In this case, the widths of the black matrices BM1, BM2, BM3, BM4, BM5, and BM6 and the widths of the color filters R-CF, G-CF, and B-CF may be changed according to a cell gap H1, which is the distance between the array substrate 101 and the color filter encapsulation substrate 130, and a thickness H2 of the black matrices BM1, BM2, BM3, BM4, BM5, and BM6. This may be designed within a range that satisfies the following equation 1.

$$(\text{cell gap} + \text{black matrix thickness}) * \tan(60°) < (\text{subpixel width} * 1.5) \quad \text{(Equation 1)}$$

In this case, preferably, a distance between the first and second black matrices BM1 and BM2, a distance W1 between the third and fourth black matrices BM3 and BM4, and a distance between the fifth and sixth black matrices BM5 and BM6, which respectively correspond to the first red subpixel 1R-SP, the second green subpixel 2G-SP, and the third blue subpixel 3B-SP disposed on the flat surfaces 230 of the first to third bank patterns 200a, 200b, and 200c, satisfy (cell gap+black matrix thickness)*tan(20°)*2. Preferably, a distance W2 between the second black matrix BM2 and the third black matrix BM3 disposed at a boundary between the first subpixel group 1GP and the second subpixel group 2GP, and a distance between the fourth black matrix BM4 and the fifth black matrix BM5 satisfy (cell gap+black matrix thickness)*tan(60°).

In this case, tan 20° and tan 60° are beam angles (=viewing angles) of light emitted from each of the subpixels 1R-SP, 1G-SP, 1B-SP, 2R-SP, 2G-SP, 2B-SP, 3R-SP, 3G-SP, and 3B-SP. Referring to FIG. 6A, light emitted from each of the subpixels 1R-SP, 1G-SP, 1B-SP, 2R-SP, 2G-SP, 2B-SP, 3R-SP, 3G-SP, and 3B-SP are emitted forward with a beam angle of about 40° (marked as region E).

In other words, all of red light, green light, and blue light emitted from the first red subpixel 1R-SP, the second green subpixel 2G-SP, and the third blue subpixel 3B-SP disposed on the flat surfaces 230 of the first to third bank patterns 200a, 200b, and 200c travel toward the color filter encapsulation substrate 130 with a beam angle in a range of −20 to +20°.

On the other hand, referring to FIG. 6B, all of red light, green light, and blue light emitted from the first blue and green subpixels 1B-SP and 1G-SP, the second red and blue subpixels 2R-SP and 2B-SP, and the third green and red subpixels 3G-SP and 3R-SP disposed on the first and second inclined surfaces 210 and 220 of the first to third bank patterns 200a, 200b, and 200c travel toward the color filter encapsulation substrate 130 with a beam angle in a range of −60 to −20° and +20 to +60° (marked as region F).

In this case, referring to FIGS. 6A and 6B, it can be seen that, for light emitted from each subpixel, a luminance of emitted forward is the highest, and a luminance of light emitted sideward is lower than that of light emitted forward.

Accordingly, light emitted from the first red subpixel 1R-SP, the second green subpixel 2G-SP, and the third blue subpixel 3B-SP disposed on the flat surfaces 230 of the first to third bank patterns 200a, 200b, and 200c travel toward the color filter encapsulation substrate 130 via the transmission portions of the black matrices BM1, BM2, BM3, BM4, BM5, and BM6 satisfying (cell gap+black matrix thickness)*tan(20°)*2. Light emitted from the first blue and green subpixels 1B-SP and 1G-SP, the second red and blue subpixels 2R-SP and 2B-SP, and the third green and red subpixels 3G-SP and 3R-SP disposed on the first and second inclined surfaces 210 and 220 of the first to third bank patterns 200a, 200b, and 200c travel toward the color filter encapsulation substrate 130 via the transmission portions of the black matrices BM1, BM2, BM3, BM4, BM5, and BM6 satisfying (cell gap+black matrix thickness)*tan(60°). Therefore, the OLED device according to an embodiment of the present disclosure may realize multiple views.

Particularly, the OLED device according to an embodiment of the present disclosure further includes the first to third bank patterns 200a, 200b, and 200c disposed below the first electrodes 111 of the LEDs E. Accordingly, all of the first-first to third-third view images V1-1, V1-2, V1-3, V2-1, V2-2, V2-3, V3-1, V3-2, and V3-3 may be realized with uniform high luminance.

In this regard, preferably, angles α formed between the passivation layer 109b and the first and second inclined surfaces 210 and 220 of the first to third bank patterns 200a, 200b, and 200c correspond to the beam angles (=viewing angles) of light emitted from the first blue and green subpixels 1B-SP and 1G-SP, the second red and blue subpixels 2R-SP and 2B-SP, and the third green and red subpixels 3G-SP and 3R-SP disposed on the first and second inclined surfaces 210 and 220 of the first to third bank patterns 200a, 200b, and 200c.

In other words, the angles α formed between the passivation layer 109b and the first and second inclined surfaces 210 and 220 of the first to third bank patterns 200a, 200b, and 200c are set to be in a range of 20 to 60° so that light, which is unable to pass through the color filters R-CF, G-CF, and B-CF disposed in a front direction of the subpixel groups 1GP, 2GP, and 3GP, and, instead, passes through the color filters R-CF, G-CF, and B-CF disposed corresponding to the neighboring subpixel groups 1GP, 2GP, and 3GP, is substantially emitted forward by the first and second inclined surfaces 210 and 220 of the first to third bank patterns 200a, 200b, and 200c.

In this case, referring to FIG. 6C, it can be seen that light emitted from the first blue and green subpixels 1B-SP and 1G-SP, the second red and blue subpixels 2R-SP and 2B-SP, and the third green and red subpixels 3G-SP and 3R-SP disposed on the first and second inclined surfaces 210 and 220 of the first to third bank patterns 200a, 200b, and 200c are emitted with a forward beam angle (marked as region G).

Accordingly, the first-second view image V1-2, the first-third view image V1-3, the second-first view image V2-1, the second-third view image V2-3, the third-first view image V3-1, and the third-second view image V3-2 substantially have the same luminance as the first-first view image V1-1, the second-second view image V2-2, and the third-third view image V3-3. In this way, all of the multi-view images may be realized with uniform high luminance.

As described above, in the OLED device according to an embodiment of the present disclosure, due to the arrangement structure of the subpixels 1R-SP, 1G-SP, 1B-SP, 2R-SP, 2G-SP, 2B-SP, 3R-SP, 3G-SP, and 3B-SP and the color filters R-CF, G-CF, and B-CF, the gaps between the subpixels 1R-SP, 1G-SP, 1B-SP, 2R-SP, 2G-SP, 2B-SP, 3R-SP, 3G-SP, and 3B-SP, and the arrangement structure of black matrices BM1, BM2, BM3, BM4, BM5, and BM6, the first-first view image V1-1, the second-first view image V2-1, and the third-first view image V3-1 of red light are respectively displayed by the first to third red subpixels 1R-SP, 2R-SP, and 3R-SP of the first to third subpixel groups 1GP, 2GP, and 3GP, the first-second view image V1-2, the second-second view image V2-2, and the third-second view image V3-2 of green light are respectively displayed by the first to third green subpixels 1G-SP, 2G-SP, and 3G-SP of the first to third subpixel groups 1GP, 2GP, and 3GP, and the first-third view image V1-3, the second-third view image V2-3, and the third-third view image V3-3 of blue light are respectively displayed by the first to third blue subpixels 1B-SP, 2B-SP, and 3B-SP of the first to third subpixel groups 1GP, 2GP, and 3GP. Accordingly, multiple views can be realized.

Particularly, by further disposing the first to third bank patterns 200a, 200b, and 200c below the first electrodes 111 of the LEDs E, the OLED device can realize all of the first-first to third-third view images V1-1, V1-2, V1-3, V2-1, V2-2, V2-3, V3-1, V3-2, and V3-3 with uniform high luminance.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A multi-view display device comprising:
a unit pixel comprising a first, a second, and a third subpixel group on an array substrate;
a first, a second, and a third bank pattern corresponding to the first, the second, and the third subpixel group, respectively, each bank pattern including a first inclined surface, a second inclined surface, and a flat surface connecting the first inclined surface and the second inclined surface; and
a red color filter corresponding to the first subpixel group, a green color filter corresponding to the second subpixel group, and a blue color filter corresponding to the third subpixel group,
wherein the red color filter, the green color filter, and the blue color filter are on a color filter encapsulation substrate above the array substrate,
wherein a first red, a first green, and a first blue subpixel of the first subpixel group are each on a different surface of the first inclined surface, the second inclined surface, and the flat surface of the first bank pattern, a second red, a second green, and a second blue subpixels of the second subpixel group are each on a different surface of the first inclined surface, the second inclined surface, and the flat surface of the second bank pattern, and a third red, a third green, and a third blue subpixel of the third subpixel group are each on a different surface of the first inclined surface, the second inclined surface, and the flat surface of the third bank pattern,
wherein the first subpixel group displays a first image, the second subpixel group displays a second image, and the third subpixel group displays a third image.

2. The multi-view display device of claim 1, wherein the first to third red, green, and blue subpixels of the second subpixel group are arranged such that a subpixel from the second subpixel group emitting one color light of red, green and blue lights is between two subpixels each from remaining two of the first subpixel group and third subpixel group emitting the same color light.

3. The multi-view display device of claim 2, wherein the first subpixel group is arranged such that the first red subpixel is between the first blue subpixel and the first green subpixel,
wherein the second subpixel group is arranged such that the second green subpixel is between the second red subpixel and the second blue subpixel, the second red subpixel adjacent to the first green subpixel, and
wherein the third subpixel group is arranged such that the third blue subpixel is between the third green subpixel and the third red subpixel, the third green subpixel adjacent to the second blue subpixel.

4. The multi-view display device of claim 1, wherein an angle between the first inclined surface and a plane of the array substrate and an angle between the second inclined surface and a plane of the array substrate are in a range of 20 to 60°.

5. The multi-view display device of claim 1, wherein, in the first subpixel group, the first blue subpixel is disposed on the first inclined surface of the first bank pattern, the first red subpixel is disposed on the flat surface of the first bank pattern, and the first green subpixel is disposed on the second inclined surface of the first bank pattern,
wherein, in the second subpixel group, the second red subpixel is disposed on the first inclined surface of the second bank pattern, the second green subpixel is disposed on the flat surface of the second bank pattern, and the second blue subpixel is disposed on the second inclined surface of the second bank pattern, and
wherein, in the third subpixel group, the third green subpixel is disposed on the first inclined surface of the third bank pattern, the third blue subpixel is disposed on the flat surface of the third bank pattern, and the third red subpixel is disposed on the second inclined surface of the third bank pattern.

6. The multi-view display device of claim 5, wherein a portion of the first bank pattern is disposed between adjacent subpixels in the first subpixel group, the portion of the first bank pattern configured to separate organic light emitting layers of the adjacent subpixels,
wherein a portion of the second bank pattern is disposed between adjacent subpixels of the second subpixel group, the portion of the second bank pattern configured to separate organic light emitting layers of the adjacent subpixels, and
wherein a portion of the third bank pattern is disposed between adjacent subpixels in the third subpixel group, the portion of the third bank pattern configured to separate organic light emitting layers of the adjacent subpixels.

7. The multi-view display device of claim 5, wherein a red light emitted from the first red subpixel of the first subpixel group passes through the red color filter corresponding to the first subpixel group and displays a red portion of the first image,
wherein a green light emitted from the first green subpixel of the first subpixel group passes through the green color filter corresponding to the second subpixel group and displays a green portion of the first image,
wherein a red light emitted from the second red subpixel of the second subpixel group passes through the red color filter corresponding to the first subpixel group and displays a red portion of the second image,
wherein a green light emitted from the second green subpixel of the second subpixel group passes through the green color filter corresponding to the second subpixel group and displays a green portion of the second image;
wherein a blue light emitted from the second blue subpixel of the second subpixel group passes through the blue color filter corresponding to the third subpixel group and displays a blue portion of the second image;
wherein a green light emitted from the third green subpixel of the third subpixel group passes through the green color filter corresponding to the second subpixel group and displays a green portion of the third image, and
wherein a blue light emitted from the third blue subpixel of the third subpixel group passes through the blue color filter corresponding to the third subpixel group and displays a blue portion of the third image.

8. The multi-view display device of claim 5, wherein the color filter encapsulation substrate further includes a black matrix that does not overlap with the first red subpixel, the second green subpixel, and the third blue subpixel, and
wherein the black matrix overlaps halves of the first green and blue subpixels, the second red and blue subpixels, and the third green and red subpixels.

9. The multi-view display device of claim 8, wherein a first portion and a second portion of the black matrix correspond to the first subpixel group,
wherein one end of the first portion of the black matrix corresponds to a central portion of the first blue subpixel, and another end of the first portion of the black matrix corresponds to one end of the first red subpixel, wherein one end of the second portion of the black matrix is spaced apart from the first portion of the black matrix by a gap corresponding to a width of the first red subpixel, and wherein the one end of the second portion of the black matrix corresponds to another end of the first red subpixel, and another end of the second portion of the black matrix corresponds to a central portion of the first green subpixel.

10. The multi-view display device of claim 9, wherein the second portion of the black matrix is spaced apart from a third portion of the black matrix, the third portion of the black matrix corresponding to the second subpixel group, by a gap corresponding to a half of a width of the first green subpixel and a half of a width of the second red subpixel.

11. The multi-view display device of claim 10, wherein the gap between the first portion of the black matrix and the second portion of the black matrix equals (a cell gap+a thickness of the black matrix)*tan(20°)*2, the cell gap corresponding to a distance between a top surface of a common electrode on the array substrate and a lower surface of the black matrix, and wherein the gap between the second portion of the black matrix and the third portion of the black matrix equals (the cell gap+the thickness of the black matrix)*tan (60°).

12. The multi-view display device of claim 1, wherein the first bank pattern, second bank pattern, and third bank pattern are on a passivation layer on a driving thin film transistor on the array substrate, and wherein the driving thin film transistor is included in each of the first to third red, green, and blue subpixels, and includes a semiconductor layer, a gate insulating layer on the semiconductor layer, a gate electrode on the gate insulating layer, an interlayer insulating layer on the gate electrode, and source and drain electrodes on the interlayer insulating layer.

13. A multi-view display device comprising:
a plurality of pixels on an array substrate, each pixel comprising:
a plurality of subpixel groups of adjacent subpixels emitting different colors in different directions, each subpixel group comprising a bank pattern including a first inclined surface, a second inclined surface, and a flat surface connecting the first inclined surface and the second inclined surface, wherein each of the first inclined surface, the second inclined surface, and the flat surface corresponds to a different one of a red subpixel, a green subpixel, or a blue subpixel of the subpixel group; and
a black matrix configured to pass portions of the emitted colored light from the subpixels and block other portions of the emitted colored light from the subpixels to form multiple images at different viewing angles relative to the multi-view display device.

14. The multi-view display device of claim 13, wherein, for each pixel, each of the plurality of subpixel groups is overlaid with one of a red color filter, a green color filter, and a blue color filter.

15. The multi-view display device of claim 14, wherein, for each pixel, a first subpixel group that is overlaid with the red color filter is arranged such that a first red subpixel is between a first blue subpixel and a first green subpixel, wherein a second subpixel group that is overlaid with the green color filter is arranged such that a second green subpixel is in between a second red subpixel and a second blue subpixel, the second subpixel group adjacent to the first subpixel group, and wherein a third subpixel group that is overlaid with the blue color filter is arranged such that a third blue subpixel is between a third green subpixel and a third red subpixel, the third subpixel group adjacent to the second subpixel group.

16. The multi-view display device of claim 15, wherein, in the first subpixel group, the first blue subpixel is disposed on the first inclined surface of a first bank pattern, the first red subpixel is disposed on the flat surface of the first bank pattern, and the first green subpixel is disposed on the second inclined surface of the first bank pattern, wherein, in the second subpixel group, the second red subpixel is disposed on the first inclined surface of a second bank pattern, the second green subpixel is disposed on the flat surface of the second bank pattern, and the second blue subpixel is disposed on the second inclined surface of the second bank pattern, and wherein, in the third subpixel group, the third green subpixel is disposed on the first inclined surface of a third bank pattern, the third blue subpixel is disposed on the flat surface of the third bank pattern, and the third red subpixel is disposed on the second inclined surface of the third bank pattern.

17. The multi-view display device of claim 16, wherein a red light emitted from the first red subpixel of the first subpixel group passes through the red color filter overlaid on the first subpixel group and displays a red portion of a first image, wherein a green light emitted from the first green subpixel of the first subpixel group passes through the green color filter overlaid on the second subpixel group and displays a green portion of the first image, wherein a red light emitted from the second red subpixel of the second subpixel group passes through the red color filter overlaid on the first subpixel group and displays a red portion of a second image, wherein a green light emitted from the second green subpixel of the second subpixel group passes through the green color filter overlaid on the second subpixel group and displays a green portion of the second image;

wherein a blue light emitted from the second blue subpixel of the second subpixel group passes through the blue color filter overlaid on the third subpixel group and displays a blue portion of the second image;

wherein a green light emitted from the third green subpixel of the third subpixel group passes through the green color filter overlaid on the second subpixel group and displays a green portion of a third image, and wherein a blue light emitted from the third blue subpixel of the third subpixel group passes through the blue color filter overlaid on the third subpixel group and displays a blue portion of the third image.

18. The multi-view display device of claim 13, wherein the black matrix does not overlap with subpixels corresponding to flat surfaces, and wherein the black matrix overlaps with halves of subpixels corresponding to first inclined surfaces or second inclined surfaces.

19. The multi-view display device of claim 18, wherein the black matrix is on a color filter encapsulation substrate above the array substrate, and wherein the black matrix is under a color filter.

* * * * *